United States Patent
Saito et al.

(10) Patent No.: US 8,299,688 B2
(45) Date of Patent: Oct. 30, 2012

(54) PIEZOELECTRIC MATERIAL, METHOD OF MANUFACTURING THE SAME, AND PIEZOELECTRIC DEVICE

(75) Inventors: Hiroshi Saito, Yokohama (JP); Toshihiro Ifuku, Yokohama (JP); Satoshi Wada, Kofu (JP); Nobuhiro Kumada, Kofu (JP); Keisuke Yamato, Kofu (JP); Takashi Iijima, Tsukuba (JP); Bong-Yeon Lee, Tsukuba (JP)

(73) Assignees: Canon Kabushiki Kaisha, Tokyo (JP); University of Yamanashi, Yamanashi (JP); National Institute of Advanced Industrial Science and Technology, Tokyo (JP)

( * ) Notice: Subject to any disclaimer, the term of this patent is extended or adjusted under 35 U.S.C. 154(b) by 115 days.

(21) Appl. No.: 12/720,833

(22) Filed: Mar. 10, 2010

(65) Prior Publication Data

US 2010/0231096 A1    Sep. 16, 2010

(30) Foreign Application Priority Data

Mar. 12, 2009    (JP) ................................ 2009-060265

(51) Int. Cl.
*H01L 41/187* (2006.01)
(52) U.S. Cl. ...................................................... 310/358
(58) Field of Classification Search .................. 310/358; 252/62.9 R, 62.9 PZ
See application file for complete search history.

(56) References Cited

U.S. PATENT DOCUMENTS

| | | | |
|---|---|---|---|
| 2005/0017269 A1 | 1/2005 | Miyazawa et al. | 257/200 |
| 2007/0181846 A1* | 8/2007 | Liufu | 252/62.9 PZ |
| 2008/0067898 A1* | 3/2008 | Aoki et al. | 310/358 |
| 2009/0236557 A1* | 9/2009 | Hibino et al. | 252/62.9 R |
| 2010/0231095 A1 | 9/2010 | Kubota et al. | 310/357 |

FOREIGN PATENT DOCUMENTS

| | | |
|---|---|---|
| JP | 2005-011931 A | 1/2005 |
| JP | 2007-221066 A | 8/2007 |
| JP | 2007-287739 A | 11/2007 |
| JP | 2008-098627 A | 4/2008 |

OTHER PUBLICATIONS

S. Wada et al., "Preparation of [110] Grain Oriented Barium Titanate Ceramics by Templated Grain Growth Method and Their Piezoelectric Properties," Japanese Journal of Applied Physics, vol. 46, No. 10B, 2007, pp. 7039-7043.

* cited by examiner

*Primary Examiner* — Derek Rosenau
(74) *Attorney, Agent, or Firm* — Fitzpatrick, Cella, Harper & Scinto

(57) ABSTRACT

Provided is a piezoelectric material having good piezoelectric properties and a Curie temperature (Tc) of 150° C. or higher, and a piezoelectric device using the piezoelectric material. The piezoelectric material includes a sintered body made of a perovskite-type metal oxide represented by the following general formula (1):

$$xBi(Mg_{1/2}Ti_{1/2})O_3\text{-}(1\text{-}x)BaTiO_3 \qquad (1),$$

where x satisfies $0.17 \leqq x \leqq 0.8$, in which an average grain size of grains contained in the sintered body is 0.5 µm or larger to 10 µm or smaller, and the sintered body is polycrystalline. In addition, the piezoelectric device includes a piezoelectric material and a pair of electrodes disposed in contact with the piezoelectric material, in which the piezoelectric material is the above-mentioned piezoelectric material.

6 Claims, 4 Drawing Sheets

PIEZOELECTRIC MATERIAL, METHOD OF MANUFACTURING THE SAME, AND PIEZOELECTRIC DEVICE

BACKGROUND OF THE INVENTION

1. Field of the Invention

The present invention relates to a piezoelectric material, a method of manufacturing the piezoelectric material, and a piezoelectric device using the material. More specifically, the present invention relates to a perovskite-type orientation piezoelectric material and a method of manufacturing thereof, in particular, to a lead-free piezoelectric material.

2. Description of the Related Art

Piezoelectric devices are devices for converting electric energy into mechanical energy, i.e., a mechanical displacement, stress or vibration, or is a device for converting in the opposite direction. Piezoelectric devices are used for ultrasonic motors, ink jet heads, and the like.

Many piezoelectric materials which are used for piezoelectric devices are called PZT, and are oxides containing lead (Pb), zirconium (Zr), and titanium (Ti). Therefore, for addressing an environmental problem, a piezoelectric material containing no lead (lead-free piezoelectric material) is being developed.

As a promising lead-free piezoelectric material, there is known a material obtained by domain engineering after controlling orientation of $BaTiO_3$, so that the piezoelectric property is improved (S. Wada, *Japanese Journal of Applied Physics*, Vol. 46, No. 10B, 2007, pp. 7039-7043). Domain engineering requires a polycrystal in (110) orientation of its micro-grains.

On the other hand, as a promising lead-free piezoelectric material having MPB composition similar to PZT, there is known $xBi(Mg_{1/3}Ti_{2/3})O_3$-$(1-x)BaTi_3$ ($0 \leq x \leq 1$), which has been synthesized only as a thin-film single crystal (Japanese Patent Application Laid-Open No. 2008-98627). The thin-film single crystal has no grains in general, and therefore domain engineering is inapplicable to the same. From a viewpoint of charge balance, as a lead-free piezoelectric material having the same element structure, $Bi(Mg_{1/2}E_{1/2})O_3$-$(1-x)BaTiO_3$ ($0 \leq x \leq 1$) (hereinafter, also referred to as "BMT-BT", which also may be written with numerals indicating a composition ratio of BMT to BT) is rather stable, and it is preferred to obtain a BMT-BT bulk material.

However, a solid solution of $Bi(Mg_{1/2}Ti_{1/2})O_3$ and $BaTiO_3$ has a disadvantage in that it is difficult to disperse the raw material powder sufficiently when they are mixed and sintered, and an undesired phase, which may be referred to as a "secondary" phase, other than perovskite may easily be formed. Therefore, it is difficult to obtain a bulk material. Thus, there has been no reported example of a bulk material of BMT-BT.

SUMMARY OF THE INVENTION

The present invention has been made in view of the background art described above, and an object thereof is to provide a BMT-BT piezoelectric material of polycrystal having good piezoelectric properties and a Curie temperature (Tc) of 150° C. or higher, and to provide a method of manufacturing a piezoelectric material.

It is another object of the present invention to provide a piezoelectric device which uses the piezoelectric material, and a liquid ejection head as well as an ultrasonic motor which uses the piezoelectric device.

A piezoelectric material which solves the above-mentioned problem includes a sintered body made of a perovskite-type metal oxide represented by the following general formula (1):

$$xBi(Mg_{1/2}Ti_{1/2})O_3\text{-}(1-x)BaTiO_3 \qquad (1)$$

where x satisfies $0.17 \leq x \leq 0.8$ and in which the sintered body is polycrystal and contains grains having an average grain size of 0.5 μm or larger to 10 μm or smaller.

A piezoelectric device which solves the above-mentioned problem includes a piezoelectric material and a pair of electrodes disposed in contact with the piezoelectric material, in which the piezoelectric material is the above-mentioned piezoelectric material.

A liquid ejection head which solves the above-mentioned problem uses the above-mentioned piezoelectric device. An ultrasonic motor which solves the above-mentioned problem uses the above-mentioned piezoelectric device.

A method of manufacturing a piezoelectric material which solves the above-mentioned problem includes a sintering step of sintering powder of a metallic compound as a raw material of the piezoelectric material, in which the raw material is powder of the metallic compound having an average grain size of 5 nm or larger to 50 nm or smaller.

In addition, a method of manufacturing a piezoelectric material which solves the above-mentioned problem includes a sintering step of sintering powder of a metallic compound as a raw material of the piezoelectric material, in which the raw material contains powder of the metallic compound containing bismuth (Bi), titanium (Ti), and magnesium (Mg) and having an average grain size of 5 nm or larger to 50 nm or smaller and powder of barium titanate having an average grain size of 10 nm or larger to 150 nm or smaller.

The present invention may provide the piezoelectric material having good piezoelectric properties and a Curie temperature (Tc) of 150° C. or higher, and the method of manufacturing the piezoelectric material.

In addition, the present invention may provide a piezoelectric device which uses the piezoelectric material, and the liquid ejection head as well as the ultrasonic motor which uses the piezoelectric device.

Further features of the present invention will become apparent from the following description of exemplary embodiments with reference to the attached drawings.

DESCRIPTION OF THE PREFERRED EMBODIMENTS

Preferred embodiments of the present invention will now be described in detail in accordance with the accompanying drawings.

Hereinafter, an embodiment of the present invention is described concretely. Note that the technical scope of the present invention is not limited to the embodiment described.

According to the present invention, there is provided a piezoelectric material including a sintered body made of a perovskite-type metal oxide represented by the following general formula (1):

$$x\text{Bi}(\text{Mg}_{1/2}\text{Ti}_{1/2})\text{O}_3\text{-}(1-x)\text{BaTiO}_3 \quad (1)$$

where x satisfies $0.17 \leq x \leq 0.8$ and in which the sintered body is polycrystalline and contains grains having an average grain size of 0.5 μm or larger to 10 μm or smaller.

As to the perovskite-type metal oxide represented by the general formula (1), x in the general formula (1) satisfies $0.17 \leq x \leq 0.8$, preferably $0.2 \leq x \leq 0.7$. If x is smaller than 0.17, Tc becomes smaller than 150° C., which is not desirable because then the available temperature range is narrow. On the other hand, if x is larger than 0.8, a secondary phase exists, and hence a single phase of perovskite is not realized.

The piezoelectric material of the present invention is represented by the general formula (1). However, even if the element ratio of A-site to B-site is a little deviated as a ceramic material, the piezoelectric material is included in the present invention as long as the piezoelectric material is the perovskite single phase. For instance, there are well-known cases in which A-site Pb is excessively used in a Pb piezoelectric material, or B-site element ratio is deviated in a composite perovskite compound. Further, the piezoelectric material of the present invention has an effect that the piezoelectric constant increases by decreasing Bi by 5% from the general formula (1).

Figure 1:
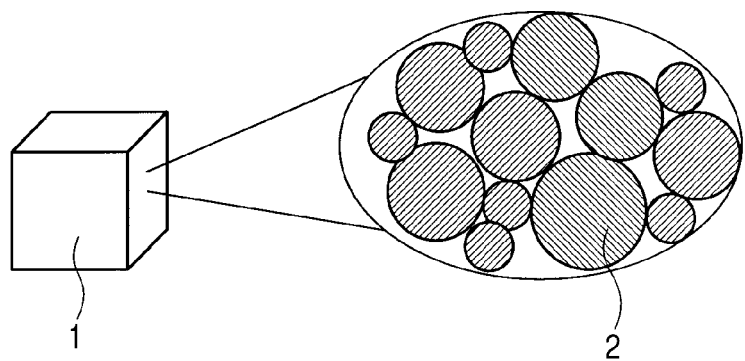
FIG. 1 is a partial schematic diagram illustrating a sintered body constituting a piezoelectric material of the present invention.

FIG. 1 is a partial schematic diagram illustrating a sintered body constituting the piezoelectric material of the present invention. FIG. 1 illustrates schematically a cross-sectional view of a part of a sintered body 1. When a cross-section of the sintered body 1 is observed with an electron microscope, various sizes of crystalline mass having the same crystal orientation are in sight. This crystalline mass is called a grain, and a lot of grains together constitute the sintered body 1. Each of the grains 2 is a single crystal having a specific crystal orientation, while the sintered body includes a lot of grains having various crystal orientations. In this way, the sintered body 1 is a set of single crystals having various crystal orientations, and forms a polycrystal.

The average grain size of grains contained in the sintered body of the piezoelectric material of the present invention is 0.5 μm or larger to 10 μm or smaller, preferably from 1.0 μm or larger to 5.0 μm or smaller. If the average grain size is smaller than 0.5 μm, sintering cannot sufficiently be completed. As a result, crystallinity is not good, and the piezoelectric property is insufficient. If the average grain size is larger than 10 μm, a domain density in the grain is decreased. Therefore, the piezoelectric property becomes insufficient as well. The average grain size of grains may be measured by observing a cross-section of the sintered body with a scanning electron microscope (SEM). The average grain size may be a volume average grain size or a number average grain size, but is preferably the number average grain size.

In addition, in the present invention, the sintered body is polycrystal. The polycrystal may be observed with the SEM.

Hereinafter, a cubic is added to a Miller index in the case where a crystal system is regarded as pseudo-cubic. The term "pseudo-cubic" means a crystal lattice which is slightly distorted from the cubic. For instance, the state of preferred orientation of (hkl) plane in the pseudo-cubic form is referred to as (hkl) cubic orientation.

The piezoelectric material of the present invention has a preferred orientation of (110) plane in the pseudo-cubic form. In other words, the piezoelectric material of the present invention has the (110) cubic orientation.

Here, the term "(110) cubic orientation" means that the Lotgering factor F described below is 10% or higher. It is preferably 15% or higher, and more preferably 50% or higher. This is because if the Lotgering factor F is lower than 10%, it is the same as no orientation property. The Lotgering factor F is calculated from Equation 1 by using a peak intensity of X-rays diffracted from a target crystal face:

$$F = (\rho - \rho_0)/(1 - \rho_0) \quad \text{(Equation 1)}$$

Here, $\rho$ is calculated by using a diffraction intensity $(I_0)$ of X-rays of a sample with no orientation. In the case of (110) cubic orientation, $\rho$ is calculated as a ratio of a sum of diffraction intensity values of the (110) cubic plane with respect to a sum of total diffraction intensity values, from Equation 2:

$$\rho_0 = \Sigma I_0(110)\text{cubic}/\Sigma I_0(hkl)\text{cubic} \quad \text{(Equation 2)}$$

Here, $\rho_o$ is calculated by using a diffraction intensity (I) of X-rays of a sample with orientation. In the case of (110) cubic orientation, similarly to Equation 2, $\rho_0$ is calculated as a ratio of a sum of diffraction intensity values of the (110) cubic plane with respect to the sum of total diffraction intensity values, from Equation 3:

$$\rho = \Sigma I(110)\text{cubic}/\Sigma I(hkl)\text{cubic} \quad \text{(Equation 3)}$$

The sintered body of the piezoelectric material of the present invention may further contain $MnO_2$ at a ratio of 0.07 mass % or larger to 2 mass % or smaller with respect to the piezoelectric material. If $MnO_2$ is contained, leak current is reduced. If the ratio of $MnO_2$ is lower than 0.07 mass %, the effect of reducing leak current cannot be obtained. On the other hand, if the ratio of $MnO_2$ is higher than 2 mass %, a secondary phase is generated undesirably.

Next, a method of manufacturing the piezoelectric material of the present invention is described.

The method of manufacturing the piezoelectric material according to the present invention includes a calcining step of mixing metallic compound powder of raw materials of the piezoelectric material and performing a heat treatment, and a sintering step of sintering the calcined powder produced by the calcining step. The average grain size of the metallic compound powder is 5 nm or larger to 50 nm or smaller.

The metallic compound of raw materials includes a Ba compound, a Ti compound, an Mg compound, and a Bi compound.

Examples of the Ba compound include at least one selected from the group consisting of $BaCO_3$, $BaO$, $BaO_2$, $BaBr_2$, $BaCl_2$, $BaF_2$, $BaI_2$, $BaF_2$, $BaSO_4$, $Ba(NO_3)_2$, $BaS$, and $BaB_6$. $BaCO_3$ is more preferred.

Examples of the Ti compound include at least one selected from the group consisting of $TiO$, $Ti_2O_3$, $TiO_2$, $TiBr_2$, $TiCl_4$, $TiB_2$, $TiH_2$, $TiN$, and $TiS_2$. $TiO_3$ is more preferred.

Examples of the Mg compound include at least one selected from the group consisting of $MgO$, $MgBr_2$, $MgCO_3$, $MgCl_2$, $MgF_2$, $MgI_2$, $Mg(NO_3)_2$, $MgC_2O_4$, $Mg_3(PO_4)_2 \cdot 8H_2O$, and $MgSO_4$. $MgO$ is more preferred.

Examples of the Bi compound include at least one selected from the group consisting of $Bi_2O_3$, $BiBr_3$, $BiCl_3$, $(BiO)_2(CO_3)$, $BiF_3$, $BiI_3$, $BiOCl$, $BiPO_4$, $Bi(OH)_3$, and $Bi_2S_3$. $Bi_2O_3$ is more preferred.

The average grain size of the metallic compound powder is 5 nm or larger to 50 nm or smaller, preferably from 7 nm or larger to 49 nm or smaller. If the average grain size is smaller than 5 nm, dispersion in the mixing becomes difficult. On the other hand, if the average grain size is larger than 50 nm, reactivity deteriorates, and hence a secondary phase is generated undesirably. The present invention uses a metallic compound having a very fine average grain size as a raw material powder.

The method of manufacturing a piezoelectric material according to the present invention uses a sintering temperature in the sintering step of 950° C. or higher to 1,220° C. or lower, preferably from 975° C. or higher to 1,200° C. or lower. If the sintering temperature is lower than 950° C., crystallinity is not improved. If the sintering temperature is higher than 1,220° C., the grain growth becomes conspicuous undesirably. In addition, if the grain growth proceeds, mechanical strength as a ceramic material becomes insufficient undesirably.

In the sintering step, the heating may be performed in the atmosphere, in oxygen, under a reduced pressure, or in vacuum.

The heating method may be any one of an ambient-pressure sintering method, a hot pressing method, a hot forging method, and a pressure sintering method such as HIP. In particular, if high pressure oxygen HIP is used, a secondary phase other than perovskite may be reduced, and evaporation of Bi may be prevented. As a result, tan δ may be reduced desirably.

A relative density of the sintered body is preferably 90% or higher, and is more preferably 95% or higher. If the relative density is lower than 90%, a relative piezoelectric constant of the sintered body is reduced conspicuously, and the mechanical strength is also reduced. The relative density is related to x in general formula (1). As described in examples, it is preferred that x be 0.2 or larger to 0.7 or smaller corresponding to the relative density of 95% or higher. It is more preferred that x be 0.2 or larger to 0.6 or smaller.

Next, an orientation step in the method of manufacturing a piezoelectric material according to the present invention is described.

The method of manufacturing a piezoelectric material according to the present invention is characterized in that there is provided the orientation step of mixing the calcined powder with anisotropically-shaped particles containing a metal of the piezoelectric material to form a molded body with orientation before the sintering step, and that the anisotropically-shaped particles have an average grain size of 1 μm or larger to 10 μm or smaller.

In addition, the method of manufacturing a piezoelectric material according to the present invention is characterized in that the anisotropically-shaped particles have a growth face of the (110) plane in the pseudo-cubic form, and that an average aspect ratio (Wg/tg) of a maximum length Wg to a thickness tg of the growth face is 2 or larger.

The above-mentioned anisotropically-shaped particles are described.

The anisotropically-shape of the anisotropically-shaped particles means that a length in the longitudinal direction is different with respect to the width direction or the thickness direction. For instance, a plate-like shape, a pillar-like shape, a needle-like shape, a petal-like shape, a scale-like shape, or the like may be exemplified preferably.

The anisotropically-shaped particles have a growth face. The growth face means the largest plane of the grain with shape anisotropy. This growth face is parallel to the (110) plane in the pseudo-cubic form. The aspect ratio (Wg/tg) of the maximum length Wg to the thickness tg of the growth face is preferably 2 or larger. If the aspect ratio (Wg/tg) is smaller than 2, it is difficult to make orientation in the orientation step described later, which is undesirable. The aspect ratio (Wg/tg) is more preferably 5 or larger, and still more preferably 10 or larger. However, if the aspect ratio (Wg/tg) becomes 100 or larger, the anisotropically-shaped particles may be destroyed when the grains are mixed in the orientation step, which may affect adversely to a Lotgering factor. Therefore, it is preferred that the aspect ratio (Wg/tg) be smaller than 100.

The average grain size of the anisotropically-shaped particles is 1 μm or larger to 10 μm or smaller, preferably 2.0 μm or larger to 8.0 μm or smaller. If the average grain size is smaller than 1 μm, shearing stress of molding in the orientation step described later is decreased. Therefore, it is difficult to make orientation. If the average grain size is larger than 10 μm, sintering property is decreased, and hence a preferred sintered body density cannot be obtained. This is not desirable.

As the anisotropically-shaped particles for use in the present invention, specifically, there are plate-like $BaTiO_3$ grains having the growth face of the (110) plane in the pseudo-cubic form, similar plate-like $Bi(Mg_{1/2}Ti_{1/2})O_3$ grains, and the like. In particular, the plate-like $BaTiO_3$ grains having the growth face of the (110) plane in the pseudo-cubic form are desirable because a single phase composition may easily be obtained.

It is necessary to disperse the anisotropically-shaped particles stably so as to produce appropriate slurry for obtaining oriented ceramic. In order to produce the appropriate slurry, it is preferred to use a binder, particularly polyvinyl pyrrolidone (PVP). A weighted mean molecular weight (Mw) of the PVP is preferably 200,000 or larger to 500,000 or smaller. By using the binder, it is possible to provide a piezoelectric material with high orientation property.

The orientation step is a step of molding the anisotropically-shaped particles so as to have orientation in the growth face thereof. Orienting the growth face means aligning the normal directions of growth faces of anisotropically-shaped particles. The molding method should be a method by which orientation of anisotropically-shaped particles may be obtained, and may preferably include a doctor blade method, a press molding method, a rolling method, an extrusion molding method, and a centrifugal molding method, for example.

Next, a piezoelectric device which uses the piezoelectric material of the present invention is described.

The piezoelectric device according to the present invention includes a piezoelectric material and a pair of electrodes disposed in contact with the piezoelectric material, and is characterized in that the piezoelectric material is the above-mentioned piezoelectric material.

A method of manufacturing a piezoelectric device of the present invention is described.

A sintered body of the piezoelectric material is polished. After polishing, an electrode is formed by a sputtering method or baking of silver paste. A material of the electrode is preferably silver, gold, platinum, or the like. An intimate contact layer made of Ti, $TiO_2$, Cr, or the like may be provided between the electrode and the piezoelectric material.

A method of manufacturing a piezoelectric device which uses a (110) cubic oriented piezoelectric material is described.

The sintered body of the (110) cubic oriented piezoelectric material before polishing has a low Lotgering factor due to deflection generated in a sintering process. Accordingly, it is preferred to use a back-reflection Laue method, for example to expose the (110) cubic plane and polish the (110) cubic oriented piezoelectric material. By polishing in this way, Lotgering factor may be enhanced. As a result, since Lotgering factor is enhanced and the effect of the orientation is further obtained, it is possible to provide a good piezoelectric property. When the electrode is formed on the polished surface of the (110) cubic oriented piezoelectric material, since component of an applied electric field in the (110) cubic orientation direction of the piezoelectric material increase, more preferable piezoelectric property can be obtained.

Next, a liquid ejection head of the present invention is described.

The liquid ejection head of the present invention includes the above-mentioned piezoelectric device. For instance, there is a liquid ejection head which is used for an ink jet head, a printer, a mist generation apparatus, or for manufacturing an electronic device.

An example of the liquid ejection head of the present invention is described with reference to FIG. 6.

Figure 6:
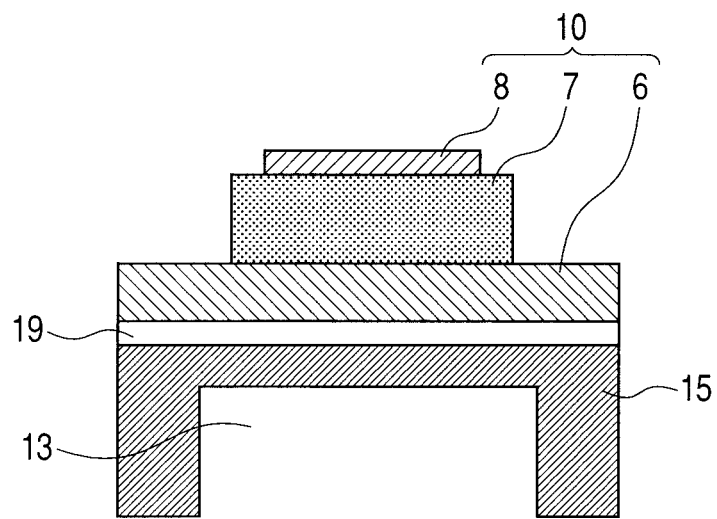
FIG. 6 is a schematic cross-section illustrating an example of an embodiment of a liquid ejection head according to the present invention.

FIG. 6 is an explanatory diagram illustrating a part of the liquid ejection head including the piezoelectric device of the present invention. A cross-sectional shape of a piezoelectric body 7 of a piezoelectric device 10 of the embodiment illustrated in FIG. 6 is a rectangular shape, but may be a trapezoid shape or an inverted trapezoid shape. A first electrode 6 and a second electrode 8 constituting the piezoelectric device 10 of the present invention may be a lower electrode and an upper electrode of a liquid ejection head, respectively, or vice versa. Similarly, a vibration plate 15 may be a part of a substrate constituting the piezoelectric device 10 of the present invention. These differences depend on the method of manufacturing the device, and the effect of the present invention may be obtained in both the cases.

In the liquid ejection head of the present invention, the vibration plate 15 moves up and down when the piezoelectric body 7 expands and contracts. Thus, pressure is applied to liquid in an individual liquid chamber, and hence the liquid is ejected from an ejection port. The liquid ejection head is equipped with an ejection port, a communication hole for communicating the ejection port (not shown) with the individual liquid chamber 13, and a common liquid chamber for supplying liquid to the individual liquid chamber 13. The liquid is supplied to the ejection port through the communication path. A part of the individual liquid chamber 13 is formed of the vibration plate 15. The piezoelectric device 10 for vibrating the vibration plate 15 is disposed outside the individual liquid chamber. When the piezoelectric device 10 is driven by a voltage applied from a power supply (not shown), the vibration plate 15 is vibrated by the piezoelectric device 10, and hence the liquid inside the individual liquid chamber 13 is ejected from the ejection port. A buffer layer 19 is also illustrated.

Next, an ultrasonic motor of the present invention is described.

The ultrasonic motor of the present invention uses the above-mentioned piezoelectric device.

Figure 7:
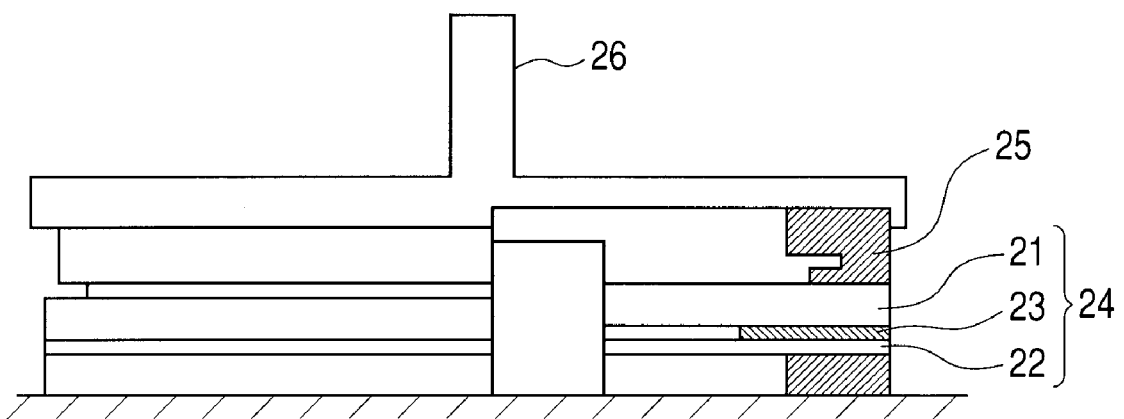
FIG. 7 is a general structural diagram illustrating an example of an embodiment of an ultrasonic motor according to the present invention.

An example of the ultrasonic motor of the present invention is illustrated in FIG. 7. The ultrasonic motor illustrated in FIG. 7 includes a piezoelectric device 22 that has a piezoelectric body made of a single plate as described above. Further, the ultrasonic motor includes a vibration body 24 in which the piezoelectric device 22 is bonded to a metal elastic ring 21 with epoxy or other adhesive 23, a rotor 25 which is in contact with a sliding surface of the vibration body 24 by pressure from a pressure spring (not shown), and an output shaft 26 that is provided to the rotor 25 in an integral manner.

When the piezoelectric body of the piezoelectric device 22 is applied with two-phase AC voltages (having phases different from each other by π/2) from the power supply, a bending traveling wave is generated in the vibration body 24, and each point on the sliding surface of the vibration body 24 makes an elliptic motion. When the rotor 25 is pressed onto the sliding surface of the vibration body 24, the rotor 25 receives a frictional force from the vibration body 24, and rotates in the direction of the elliptic motions on the vibration body sliding surface. The rotation of the rotor 25 is transmitted via the output shaft 26 to a driven member which is connected to the output shaft with a coupling or the like, and the driven member is driven. This type of motor utilizes a principle that the elastic member made of a metal or the like is bent if the piezoelectric device is bonded to the elastic member because the piezoelectric body is expanded and contracted by the lateral piezoelectric effect when a voltage is applied to the piezoelectric body.

Hereinafter, the present invention is described concretely with reference to examples.

EXAMPLE 1

The piezoelectric material was manufactured according to $xBi(Mg_{1/2}Ti_{1/2})O_3-(1-x)BaTiO_3$ ($0 \leq x \leq 1$) with x equal to 0.6.

As raw material powders, $BiO_2$ (manufactured by RARE METALLIC Co., LTD., having an average grain size of 45 nm), TiO (manufactured by ISHIHARA SANGYO KAISHA, LTD., having an average grain size of 7 nm), MgO (manufactured by Ube Material Industries, Ltd., having an average grain size of 49 nm), and $BaCO_3$ (manufactured by Ube Material Industries, Ltd., having an average grain size of 40 nm) were used. The piezoelectric materials of the examples are characterized by the metallic compound powders used as raw-material powders having very fine average grain sizes. The metallic compound powders having very fine average grain sizes are used, whereby raw material powders are sufficiently dispersed in the sintering process, and hence a good piezoelectric material may be obtained.

The individual metal elements of the raw materials were weighed so as to satisfy the molar ratio of $0.6Bi(Mg_{1/2}Ti_{1/2})O_3-0.4BaTiO_3$ and were mixed in a ball mill Bi has a high vapor pressure, and hence there is a possibility that Bi becomes insufficient. Therefore, it is preferred to add more $BiO_2$ than the above-mentioned molar ratio. The individual raw materials were mixed in the ball mill. After mixing, calcination was performed at 950° C. for 6 hours, and the material was crushed in the ball mill again. After drying, PVB was added as a binder to mold the material in a disc shape having a diameter of 10 mm. This sample was heated at 700° C. for 10 hours to remove the binder and was sintered at 1,000° C. for 2 hours to obtain the sintered body.

Figure 2:
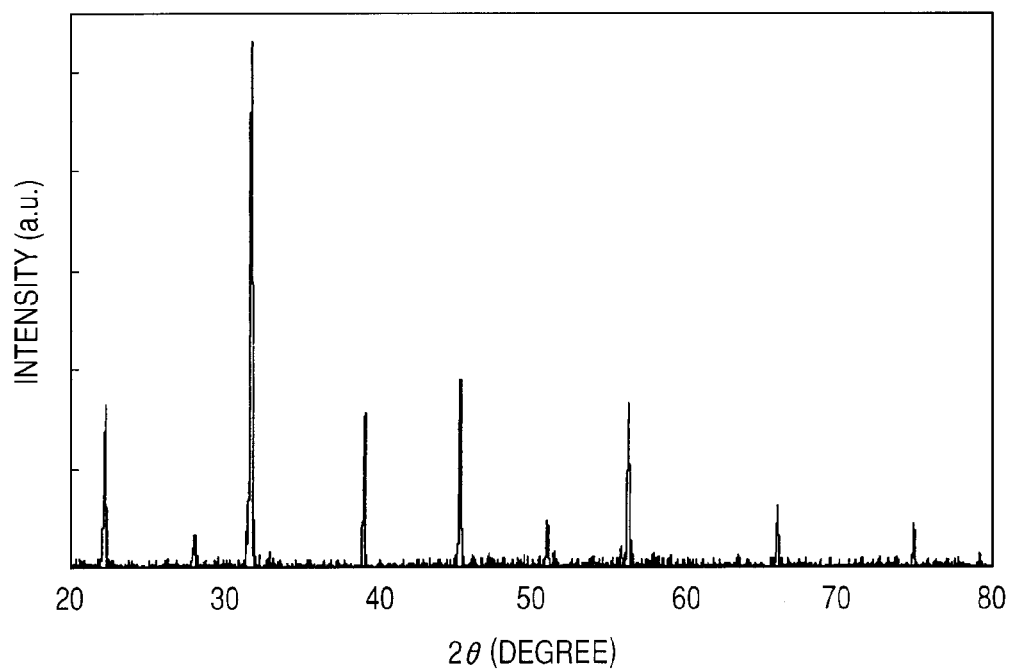
FIG. 2 is a graph showing an XRD pattern of 0.6BMT-0.4BT.

The crystal structure of the sintered body was analyzed by using an X-ray diffraction (XRD) apparatus. A result of the XRD analysis is illustrated in FIG. 2. The density thereof was evaluated by Archimedes' method. The relative density thereof was determined as a ratio of a measured value of the density to a theoretical density obtained by the XRD analysis of the crystal structure.

Figure 3:
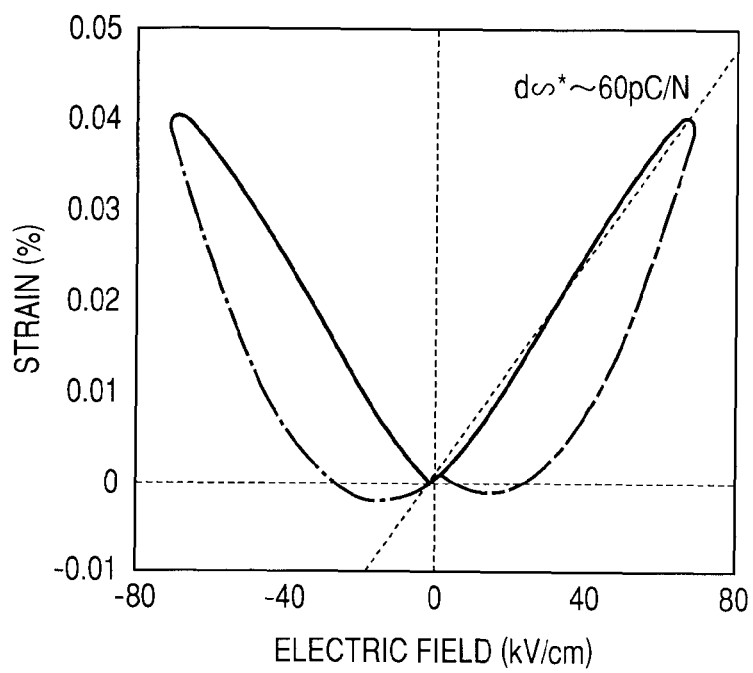
FIG. 3 is a graph showing an electric field strain curve of 0.6BMT-0.4BT.

The sample was polished and cut, and then a silver electrode was formed. After that, the piezoelectric property was evaluated. As the piezoelectric property, the piezoelectric constant (d33 constant) was determined from a gradient of strain obtained by measuring the electric field strain. A result of the measurement of the electric field strain is illustrated in FIG. 3. Because a butterfly type strain was obtained, the sample was confirmed to be ferroelectric.

The Curie temperature (Tc) was determined from a peak position in the temperature property of the piezoelectric constant. The temperature property of the piezoelectric constant was determined by measuring the piezoelectric constant at 1

Figure 4:
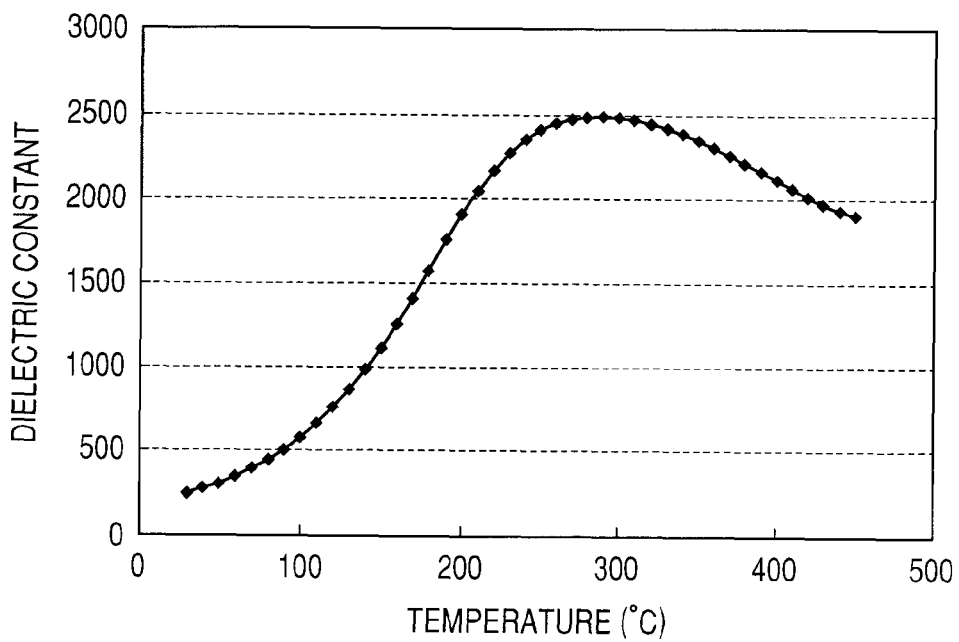
FIG. 4 is a graph showing a temperature property of a piezoelectric constant of 0.6BMT-0.4BT.

MHz every 10° C. at a temperature rise rate of 3° C. per minute. The result is illustrated in FIG. 4.

The average grain size of the sintered body was observed with the SEM and was determined as the number average grain size. A result of the above-mentioned process is shown in Table 1.

EXAMPLE 2

The piezoelectric material was manufactured according to $xBi(Mg_{1/2}Ti_{1/2})O_3$-$(1-x)BaTiO_3$ ($0 \leq x \leq 1$) with x equal to 0.17, similarly to Example 1. The sintering temperature was 1,220° C.

EXAMPLE 3

The piezoelectric material was manufactured according to $xBi(Mg_{1/2}Ti_{1/2})O_3$-$(1-x)BaTiO_3$ ($0 \leq x \leq 1$) with x equal to 0.8, similarly to Example 1. The calcination temperature was 900° C., and the sintering temperature was 950° C.

EXAMPLE 4

The piezoelectric material was manufactured according to $xBi(Mg_{1/2}Ti_{1/2})O_3$-$(1-x)BaTiO_3$ ($0 \leq x \leq 1$) with x equal to 0.2, similarly to Example 1. The sintering temperature was 1,200° C.

EXAMPLE 5

The piezoelectric material was manufactured according to $xBi(Mg_{1/2}Ti_{1/2})O_3$-$(1-x)BaTiO_3$ ($0 \leq x \leq 1$) with x equal to 0.3, similarly to Example 1. The sintering temperature was 1,150° C.

EXAMPLE 6

The piezoelectric material was manufactured according to $xBi(Mg_{1/2}Ti_{1/2})O_3$-$(1-x)BaTiO_3$ ($0 \leq x \leq 1$) with x equal to 0.4, similarly to Example 1. The sintering temperature was 1,100° C.

EXAMPLE 7

The piezoelectric material was manufactured according to $xBi(Mg_{1/2}Ti_{1/2})O_3$-$(1-x)BaTiO_3$ ($0 \leq x \leq 1$) with x equal to 0.5, similarly to Example 1. The sintering temperature was 1,050° C.

EXAMPLE 8

The piezoelectric material was manufactured according to $xBi(Mg_{1/2}Ti_{1/2})O_3$-$(1-x)BaTiO_3$ ($0 \leq x \leq 1$) with x equal to 0.7, similarly to Example 1. The sintering temperature was 975° C.

In the above-mentioned Examples 2 to 8, similarly to Example 1, the relative density, the piezoelectric constant, Tc, and the average grain size were determined. The result is shown in Table 1.

COMPARATIVE EXAMPLE 1

The piezoelectric material was manufactured according to $xBi(Mg_{1/2}Ti_{1/2})O_3$-$(1-x)BaTiO_3$ ($0 \leq x \leq 1$) with x equal to 0.1, similarly to Example 1. The sintering temperature was 1,250° C.

Similarly to Example 1, the relative density, the piezoelectric constant, Tc, and the average grain size were determined. The result is shown in Table 1.

COMPARATIVE EXAMPLE 2

The piezoelectric material was manufactured according to $xBi(Mg_{1/2}Ti_{1/2})O_3$-$(1-x)BaTiO_3$ ($0 \leq x \leq 1$) with x equal to 0.9, similarly to Example 1. Note that the calcination was performed at a temperature of 900° C., but a single phase of perovskite was not obtained.

TABLE 1

| | x | Tc (° C.) | Piezoelectric constant (pm/V) | Relative density (%) | Average grain size (μm) |
|---|---|---|---|---|---|
| Example 1 | 0.6 | 290 | 58.7 | 95.2 | 1.3 |
| Example 2 | 0.17 | 150 | 40.3 | 90.2 | 2.3 |
| Example 3 | 0.8 | 290 | 39.6 | 94.3 | 1.0 |
| Example 4 | 0.2 | 190 | 42.5 | 96.4 | 1.6 |
| Example 5 | 0.3 | 260 | 43.7 | 97.2 | 1.5 |
| Example 6 | 0.4 | 270 | 53.5 | 97.4 | 2.0 |
| Example 7 | 0.5 | 370 | 55.2 | 98.0 | 1.4 |
| Example 8 | 0.7 | 290 | 47.1 | 96.2 | 1.6 |
| Comparative Example 1 | 0.1 | 50 | 27.4 | 91.4 | 3.4 |

Figure 5:
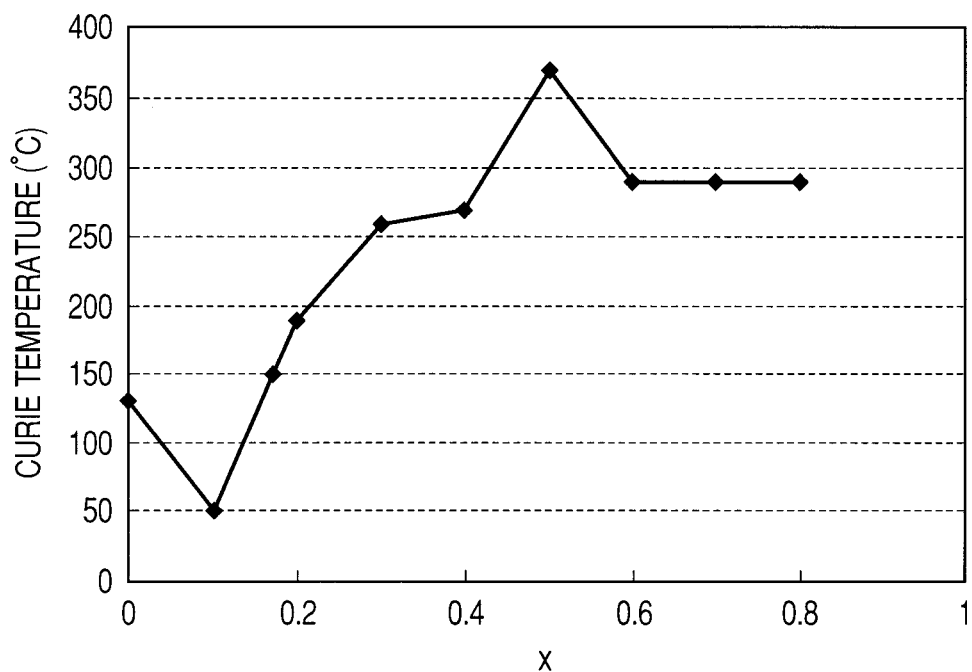
FIG. 5 is a graph showing a relationship between x and the Curie temperature of xBMT-(1-x)BT.

From Table 1, a relationship between x and Tc in $xBi(Mg_{1/2}Ti_{1/2})O_3$-$(1-x)BaTiO_3$ ($0 \leq x \leq 1$) is illustrated in FIG. 5. Referring to FIG. 5, if x is 0.17 or larger to 0.8 or smaller, the Curie temperature (Tc) is higher than 150° C., and hence the range is a desirable range. If x is 0.2 or larger to 0.8 or smaller, Tc is higher than 190° C., and hence the range is a desirable range. On the other hand, as Comparative Example 1 shows, if x is smaller than 0.17, Tc becomes 130° C. or lower, which is the Curie temperature of $BaTiO_3$ (x=0). This is not desirable. In addition, as Comparative Example 2 shows, if x is larger than 0.8, a secondary phase other than perovskite is generated. This is not desirable.

EXAMPLES 9 TO 17

The piezoelectric materials of Examples 9 to 17 were manufactured according to $xBi(Mg_{1/2}T_{1/2})O_3$-$(1-x)BaTiO_3$ ($0 \leq x \leq 1$) under the manufacturing condition shown in Table 2. The sintering temperature was 1,220° C. in Examples 9 to 11. The sintering temperature in Examples 12 to 14 was 1,000° C. The sintering temperature in Examples 15 to 17 was 950° C. Similarly to Example 1, a result of determining the relative density, the piezoelectric constant, and the average grain size is shown in Table 3.

COMPARATIVE EXAMPLES 3 TO 8

The piezoelectric materials of Comparative Examples 3 to 8 were manufactured according to $xBi(Mg_{1/2}Ti_{1/2})O_3$-$(1-x)BaTiO_3$ ($0 \leq x \leq 1$) under the manufacturing condition shown in Table 2. The sintering temperature was 1,220° C. in Comparative Examples 3 and 4. The sintering temperature in Comparative Examples 5 and 6 was 1,000° C. The sintering temperature in Comparative Examples 7 and 8 was 950° C. Similarly to Example 1, a result of determining the relative density, the piezoelectric constant, and the average grain size is shown in Table 3.

TABLE 2

|  | x | Sintering temperature (° C.) | Sintering time (hr) |
|---|---|---|---|
| Example 9 | 0.17 | 1220 | 1 |
| Example 10 | 0.17 | 1220 | 4 |
| Example 11 | 0.17 | 1220 | 10 |
| Example 12 | 0.6 | 1000 | 1 |
| Example 13 | 0.6 | 1000 | 4 |
| Example 14 | 0.6 | 1000 | 10 |
| Example 15 | 0.8 | 950 | 1 |
| Example 16 | 0.8 | 950 | 4 |
| Example 17 | 0.8 | 950 | 10 |
| Comparative Example 3 | 0.17 | 1220 | 0.5 |
| Comparative Example 4 | 0.17 | 1220 | 20 |
| Comparative Example 5 | 0.6 | 1000 | 0.5 |
| Comparative Example 6 | 0.6 | 1000 | 20 |
| Comparative Example 7 | 0.8 | 950 | 0.5 |
| Comparative Example 8 | 0.8 | 950 | 20 |

TABLE 3

|  | Average grain size (μm) | Piezoelectric constant (pm/V) | Relative density (%) |
|---|---|---|---|
| Example 9 | 0.68 | 34.6 | 90.0 |
| Example 10 | 4.4 | 40.6 | 92.1 |
| Example 11 | 9.1 | 40.0 | 90.4 |
| Example 12 | 0.54 | 36.2 | 90.2 |
| Example 13 | 4.6 | 51.3 | 95.3 |
| Example 14 | 8.3 | 43.1 | 92.3 |
| Example 15 | 0.81 | 37.3 | 92.5 |
| Example 16 | 4.7 | 39.4 | 94.3 |
| Example 17 | 7.9 | 38.0 | 93.6 |
| Example 18 | 1.4 | 70.6 | 95.6 |
| Comparative Example 3 | 0.27 | 1.1 | 88.3 |
| Comparative Example 4 | 33.2 | 16.2 | 87.9 |
| Comparative Example 5 | 0.28 | 3.1 | 89.4 |
| Comparative Example 6 | 48.3 | 24.1 | 89.8 |
| Comparative Example 7 | 0.28 | 2.2 | 87.6 |
| Comparative Example 8 | 41.3 | 21.4 | 88.1 |

According to Table 3, it is understood from Comparative Examples 3, 5, and 7 that if the grain size is smaller than 0.5 μm, the sintering becomes insufficient, the relative density is lower than 90%, and the piezoelectric constant is also very small. On the other hand, as shown in Comparative Examples 4, 6, and 8, if the grain size is larger than 10 μm, the piezoelectric constant becomes a half of that in the case where the grain size is 0.5 μm or larger to 10 μm or smaller as shown in Examples 9 to 16. This is not desirable. Therefore, it is desirable that the grain size be 0.5 μm or larger to 10 μm or smaller. More desirably, the grain size is 1 μm or larger to 5 μm or smaller because the density becomes 95% or higher.

EXAMPLE 18

A sample using barium titanate as a raw material was manufactured according to $xBi(Mg_{1/2}Ti_{1/2})O_3\text{-}(1\text{-}x)BaTiO_3$ ($0 \leq x \leq 1$) with x equal to 0.6 as follows.

As raw material powders, $BiO_2$ (manufactured by RARE METALLIC Co., LTD, having an average grain size of 45 nm), TiO (manufactured by ISHIHARA SANGYO KAISHA, LTD., having an average grain size of 7 nm), MgO (manufactured by Ube Material Industries, Ltd., having an average grain size of 49 nm), and $BaTiO_3$ (manufactured by Sakai Chemical Industry Co., Ltd., having an average grain size of 100 nm) were used. Other steps were performed similarly to Example 1. The sintering temperature was 950° C. Similarly to Example 1, the relative density, the piezoelectric constant, and the average grain size were determined. As a result, the relative density was 95.6%, the piezoelectric constant was 70.6 pm/V, and the average grain size was 1.4 μm. Compared with Example 1, a higher piezoelectric constant may be obtained at lower temperature desirably. In this way, in addition to the metallic compound powders containing Bi, Ti, and Mg having an average grain size of 5 nm or larger to 50 nm or smaller, barium titanate having an average grain size of 10 nm or larger to 150 nm or smaller is further contained. Thus, dispersion of raw material powders is accelerated, and hence a good piezoelectric material may be obtained.

EXAMPLE 19

A sample having (110) cubic orientation was manufactured according to $xBi(Mg_{1/2}Ti_{1/2})O_3\text{-}(1\text{-}x)BaTiO_3$ ($0 \leq x \leq 1$) with x equal to 0.6 as follows.

First, the calcined powder of $0.67Bn(Mg_{1/2}Ti_{1/2})O_3\text{-}0.33BaTiO_3$ was manufactured similarly to the calcined powder of Example 1.

Next, in this example, plate-like $BaTiO_3$ (manufactured by Konoshima Chemical Co., Ltd.) was used as the anisotropically-shaped particles. The plate-like $BaTiO_3$ had the growth face of (110) cubic. In addition, an average aspect ratio (Wg/Tg) was 12.3.

Using the above-mentioned calcined powder and the plate-like $BaTiO_3$, the orientation step was performed as follows. The calcined powder and the plate-like $BaTiO_3$ were weighed at the molar ratio of the calcined powder to $BaTiO_3$=9:1. A mixed solution of 55 vol % of toluene plus 45 vol % of ethanol is added to the weighed powders at a weight ratio of 90 wt % with respect to the powders. Further, 400,000 Mw of PVP and plasticizer (butyl phthalate) were added as a binder to the above-mentioned powders at 6 wt % each with respect to the powders. A wet mixing process of this mixture was performed in the ball mill for five hours so as to produce the slurry.

Next, using a doctor blade device, the slurry was molded into a tape-like shape having a thickness of 100 μm and was dried. Further, 25 sheets of the tape were stacked and were pressure-bonded under the condition of 80° C. and 100 kg/cm² (9.8 MPa) for ten minutes so that the molded body having a thickness of 2.3 mm was obtained.

The obtained molded body was heated at 700° C. for ten hours so that the binder was removed, and then the sintering process was performed at 1,000° C. for 2 hours. The (110) cubic plane of the sintered body was exposed and polished by using the back Laue method. After polishing, the XRD pattern was measured. As a reference of no orientation, the XRD pattern of the sample of Example 1 was used to calculate the Lotgering factor F. As a result, F was 63.4%. In addition, similarly to Example 1, the d33 constant was determined. As a result, the d33 constant was 71.3 (pm/V).

In addition, the average aspect ratio (Wg/Tg) was changed to 5.0 in similar manufacture and evaluation. As a result, F was 14%, and the d33 constant was 63.4 (pm/V). In addition, the density was 93.5%.

COMPARATIVE EXAMPLE 9

A sample with (110) orientation was manufactured according to $xBi(Mg_{1/2}Ti_{1/2})O_3\text{-}(1\text{-}x)BaTiO_3$ ($0 \leq x \leq 1$) with x equal to 0.6, similarly to Example 18. However, before mixing with the calcined powder, the plate-like $BaTiO_3$ was shredded by zirconia microbeads of Φ30 μm for ten hours. As a result, an average aspect ratio (Wg/Tg) was 1.41.

Similarly to Example 19, the Lotgering factor F was determined, and F was 8.2%. The d33 constant was 57.9 (pm/V) in this case.

In the case of (110) cubic orientation as in Example 19, the d33 constant increases by 21% desirably. In particular, it is desirable that the Lotgering factor F be 50% or higher.

It is understood from comparison between Example 19 and Comparative Example 9 that if the average aspect ratio (Wg/Tg) of the plate-like $BaTiO_3$ is smaller than 2, the Lotgering factor F becomes 10% or lower, and hence the d33 constant does not increase. This is undesirable.

EXAMPLE 20

A sample was manufactured according to $xBi(Mg_{1/2}T_{1/2})O_3$-$(1-x)BaTiO_3$ ($0 \leq x \leq 1$) with x set to 0.6, similarly to Example 1. However, the binder was added after the mixing process so that $MnO_2$ becomes 0.5 wt % with respect to the calcined powder.

Similarly to Example 1, after making the electrode, it is formed to be a rectangular shape of 2 mm×2 mm having a thickness of 0.5 mm, and the leak current was measured. The result is shown in Table 4.

EXAMPLE 21

A sample was manufactured according to $xBi(Mg_{1/2}T_{1/2})O_3$-$(1-x)BaTiO_3$ ($0 \leq x \leq 1$) with x set to 0.6, similarly to Example 1. However, the binder was added after the mixing process so that $MnO_2$ becomes 0.07 mass % with respect to the calcined powder.

Similarly to Example 1, after making the electrode, it is formed to be a rectangular shape of 2 mm×2 mm having a thickness of 0.5 mm, and the leak current was measured. The result is shown in Table 4.

EXAMPLE 22

A sample was manufactured according to $xBi(Mg_{1/2}T_{1/2})O_3$-$(1-x)BaTiO_3$ ($0 \leq x \leq 1$) with x set to 0.6, similarly to Example 1. However, the binder was added after the mixing process so that $MnO_2$ becomes 2 mass % with respect to the calcined powder.

Similarly to Example 1, after making the electrode, it is formed to be a rectangular shape of 2 mm×2 mm having a thickness of 0.5 mm, and the leak current was measured. The result is shown in Table 4.

TABLE 4

|  | $MnO_2$ addition amount (wt %) | Leak current (pA/V) |
| --- | --- | --- |
| Example 1 | 0 | 10.9 |
| Example 20 | 0.5 | 6.92 |
| Example 21 | 0.07 | 9.22 |
| Example 22 | 2.0 | 7.43 |

The leak current of the piezoelectric body of Example 1 was measured similarly to Example 20, and the result was 10.9 (pA). As shown in Table 4, if $MnO_2$ is added at a ratio of 0.07 mass % or larger to 2 mass % or smaller, the leak current is reduced desirably compared with Example 1.

COMPARATIVE EXAMPLE 10

The piezoelectric material was manufactured according to $xBi(Mg_{1/2}Ti_{1/2})O_3$-$(1-x)BaTiO_3$ ($0 \leq x \leq 1$) with x equal to 0.6, similarly to Example 1. However, the average grain size of the individual raw material powders was 3 nm. When these raw material powders were mixed, they were not dispersed sufficiently and uniform calcined powder could not be obtained.

COMPARATIVE EXAMPLE 11

The piezoelectric material was manufactured according to $xBi(Mg_{1/2}Ti_{1/2})O_3$-$(1-x)BaTiO_3$ ($0 \leq x \leq 1$) with x equal to 0.6, similarly to Example 1. The average grain size of the individual raw material powders was 100 nm.

From the XRD pattern of the sintered body, it was found that a lot of secondary phases other than perovskite were contained.

As described above, it is understood from Example 1 that if the average grain size of the raw material powders is 5 nm or larger to 50 nm or smaller, a good piezoelectric material having substantially no secondary phase other than perovskite may be obtained desirably. In addition, it is understood from Example 18 that the dispersion of raw material powders is accelerated desirably because barium titanate having an average grain size of 10 nm or larger to 150 nm or smaller is further contained in addition to the metallic compound powders containing Bi, Ti and Mg and having an average grain size of 5 nm or larger to 50 nm or smaller.

However, it is understood from Comparative Example 10 that if the average grain size of the individual raw material powders is smaller than 5 nm, dispersion becomes difficult, and hence uniform calcined powder cannot be obtained. This is undesirable. In addition, it is understood from Comparative Example 11 that if the average grain size of the individual raw material powders is larger than 50 nm, a lot of secondary phases other than perovskite are contained undesirably.

The sintered body of Example 1 was processed into a ring-like shape to form the piezoelectric device. This was used for manufacturing the ultrasonic motor, and it was confirmed that the motor had enough driving force to be used as an ultrasonic motor.

According to the present invention, it is possible to provide the piezoelectric material having good piezoelectric properties and a Curie temperature (Tc) of 150° C. or higher. The piezoelectric material of the present invention may be used for devices using a piezoelectric material, such as a ferroelectric memory, a liquid ejection head such as a thin film piezoelectric ink jet head, an ultrasonic motor.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-060265, filed Mar. 12, 2009, which is hereby incorporated by reference herein in its entirety.

What is claimed is:

1. A piezoelectric material comprising a sintered body made of a perovskite-type metal oxide represented by the following general formula (1):

$$x\text{Bi}(\text{Mg}_{1/2}\text{Ti}_{1/2})\text{O}_3\text{-}(1\text{-}x)\text{BaTiO}_3 \quad (1)$$

where x satisfies $0.2 \leqq x \leqq 0.7$, and wherein the sintered body is polycrystal and contains grains having an average grain size of 1.3 μm or larger to 4.6 μm or smaller.

2. The piezoelectric material according to claim 1, wherein the piezoelectric material has a preferred orientation of (110) plane in a pseudo-cubic form.

3. The piezoelectric material according to claim 1, further comprising MnO2 of 0.07 mass % or more to 2 mass % or less.

4. A piezoelectric device comprising:
a piezoelectric material; and
a pair of electrodes disposed in contact with the piezoelectric material,
wherein the piezoelectric material is the piezoelectric material according to claim 1.

5. A liquid ejection head comprising the piezoelectric device according to claim 4.

6. An ultrasonic motor comprising the piezoelectric device according to claim 4.

* * * * *